United States Patent
Bhattacharya et al.

(10) Patent No.: US 7,529,070 B2
(45) Date of Patent: May 5, 2009

(54) POWER PIN TO POWER PIN ELECTRO-STATIC DISCHARGE (ESD) CLAMP

(75) Inventors: Dipankar Bhattacharya, Macungie, PA (US); John Kriz, Palmerton, PA (US); Che Coi Leung, Bethlehem Township, Northhampton County, PA (US); Duane J. Loeper, Spring City, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 150 days.

(21) Appl. No.: 11/076,850

(22) Filed: Mar. 11, 2005

(65) Prior Publication Data

US 2006/0203405 A1 Sep. 14, 2006

(51) Int. Cl.
*H02H 9/00* (2006.01)
(52) U.S. Cl. .................. 361/56; 361/91.1; 361/111
(58) Field of Classification Search .............. 361/56, 361/91.1, 111
See application file for complete search history.

(56) References Cited

U.S. PATENT DOCUMENTS

| | | | |
|---|---|---|---|
| 5,239,440 A | 8/1993 | Merrill | |
| 5,345,357 A | 9/1994 | Pianka | |
| 5,631,793 A * | 5/1997 | Ker et al. | 361/56 |
| 5,991,135 A * | 11/1999 | Saleh | 361/56 |
| 6,118,640 A * | 9/2000 | Kwong | 361/56 |
| 6,249,410 B1 * | 6/2001 | Ker et al. | 361/56 |
| 6,455,902 B1 * | 9/2002 | Voldman | 257/378 |
| 2003/0039084 A1 * | 2/2003 | Hatzilambrou et al. | 361/56 |

* cited by examiner

*Primary Examiner*—Stephen W Jackson
*Assistant Examiner*—Terrence R Willoughby

(57) ABSTRACT

An ESD clamp circuit for use between separate power rails. An ESD clamp is based on a wide nMOSFET. A symmetrical circuit is designed vis-à-vis the two power rails, with respect to ground, allowing discharge of an ESD surge in both polarities of stress. An nMOSFET device drives the gate of a large nMOSFET (e.g., having a device width between 1000 and 10,000 microns). The large power rail-to-power rail nMOSFET has its gate controlled by the output inverter stage of either ESD detection circuit connected to a respective power supply rail. The gate is switched to a common ground during normal operation of the integrated circuit.

25 Claims, 6 Drawing Sheets

POWER PIN TO POWER PIN ELECTRO-STATIC DISCHARGE (ESD) CLAMP

BACKGROUND OF THE INVENTION

1. Field of the Invention

This invention relates to integrated circuits, and more particularly, to a circuit and method to better protect electrical circuits such as an integrated circuit from electro-static discharge (ESD) damage.

2. Background of Related Art

Electro-static discharge (ESD) is a potentially harmful high voltage spike of electricity that can be catastrophic to one or all integrated circuits (ICs) in an electronic device. Many will appreciate the spark that occurs between ones finger and a grounded metal object after shuffling ones feet across a wool rug.

The possibility of ESD exposure has been accommodated in many conventional integrated circuits (ICs). To provide an ESD discharge path between two isolated power pins a few methods are used.

FIG. 4 shows a conventional technique for providing an electrostatic discharge (ESD) path between two power pins.

In particular, as shown in FIG. 4, back to back diodes 202a, 202b are placed between two separate power supplies (e.g., between two separate power rails PWR1 and PWR2). However, the circuit of FIG. 4 is applicable only to the limited situation where both power rails PWR1 and PWR2 operate at the same voltage level. Also, the conventional technique of FIG. 4 requires that both power supplies PWR1, PWR2 track each other such that both of the power supplies PWR1, PWR2 are ON at the same time, or both of the power supplies PWR1, PWR2 are OFF at the same time.

For instance, a user cannot turn OFF just one of the power supplies PWR1 or PWR2 to save power, since one of the two back-to-back diodes 202a, 202b will be forward biased. In this scenario the power supply that is turned OFF would actually receive power from the other power supply that is still ON, through the forward biased one of the two diodes 202a, 202b.

FIG. 5 shows a more flexible approach to providing an electrostatic discharge path between two isolated power pins.

In particular, as shown in FIG. 5, an ESD diode 102a, 102b together with an ESD clamp circuit 101a, 101b are provided between each power supply rail PWR1, PWR2 and ground GND, respectively, providing separate protection to each power supply rail PWR1, PWR2. Thus, ESD protection relies on ESD clamps 101a and diode(s) 102a between a first power rail PWR1 connected to a first external power pin, and ground GND, and a similar ESD clamp 101b and diode(s) 102b connected between the second power rail PWR2 connected to a second external power pin, and ground GND.

FIG. 6 shows in more detail a conventional technique for providing an electrostatic discharge path between two isolated power pins shown in FIG. 5.

In particular, as shown in FIG. 6, the ESD clamp circuits 101a, 101b shown in FIG. 5 includes an RC circuit comprising a resistor 302 and capacitor 304, a series of three inverters 306-310, and an n-channel metal oxide semiconductor field effect transistor (nMOSFET) 312 driven by the output of the last inverter stage 310.

One problem associated with the conventional technique shown in FIGS. 5 and 6 is that the voltage drop across the path between power and ground may be too high such that it will cause MOSFET breakdown.

There is a need to accommodate and improve upon the current ESD designs to better avoid the danger of electrostatic discharge exposure in an integrated circuit (IC) or functionally similar device.

SUMMARY OF THE INVENTION

In accordance with the principles of the present invention, an integrated circuit including an electrostatic discharge clamp circuit for dual power supplies comprises a first ESD event detection circuit connected to a first power supply rail. A second ESD event detection circuit is connected to a second power supply rail. A power rail-to-power rail field effect transistor has a channel connected between the first power rail and the second power rail, and a gate activated either by the first ESD event detection circuit or by the second ESD event detection circuit.

In accordance with another aspect of the present invention, a method of clamping an electrostatic discharge pulse in an integrated circuit having at least two different power supply rails comprises sensing an ESD event on at least one of the at least two different power supply rails. Current is passed through a power rail-to-power rail field effect transistor that has a channel connected directly across the at least two different power supply rails.

BRIEF DESCRIPTION OF THE DRAWINGS

Features and advantages of the present invention will become apparent to those skilled in the art from the following description with reference to the drawings, in which.

DETAILED DESCRIPTION OF THE ILLUSTRATIVE EMBODIMENTS

The present invention provides an ESD clamp circuit for use between separate power rails. The disclosed ESD clamp is based on a wide n-channel Metal Oxide Semiconductor Field Effect Transistor (nMOSFET). The present application is most applicable to a device wherein the separate power rails would each be connected to a pin external to the device.

In accordance with the principles of the present invention, a symmetrical circuit is designed vis-à-vis the two power rails, with respect to ground GND, allowing discharge of an ESD surge in both polarities of stress. As disclosed, an nMOSFET device drives the gate of a large nMOSFET. It is noted that the gate VG cannot be driven directly by a full inverter stage (e.g., the M3PA/M3NA pair or the M3PB/M3NB pair shown in FIG. 1) since the inherent diodes (e.g., D3A or D3B) will turn ON and discharge to the grounded power supply, hence clamping the gate voltage VG to a diode above ground GND.

Figure 1:
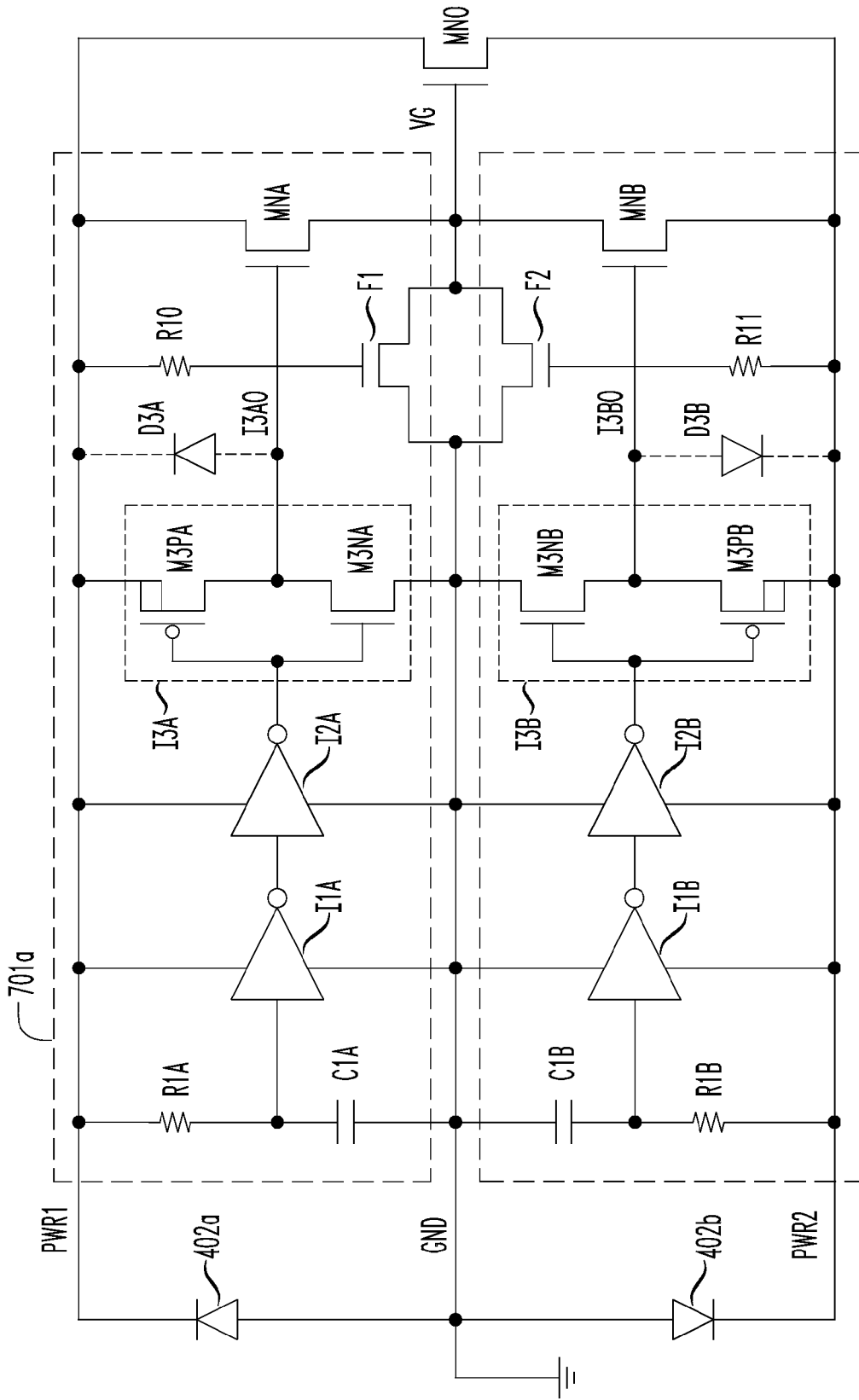
FIG. 1 shows an exemplary ESD clamp for a multiple power supply device, in accordance with the principles of the present invention.

FIG. 1 shows an exemplary ESD clamp for a multiple power supply device, in accordance with the principles of the present invention.

The ESD clamp illustrated in FIG. 1 for two power supply rails is symmetrical with respect to the GND node, shown horizontally through FIG. 1, and node VG. Therefore operation of only one-half of the illustrated ESD clamp is necessary to explain operation of the ESD clamp for two power supply rails since operation of the other half of the ESD clamp is similar.

During operation of the ESD clamp for two power supply rails absent an ESD event, the gate node VG of the large nMOSFET MN0 is pulled to ground by two nMOSFET transistors F1 and F2. With the gate node VG of the large nMOSFET MN0 at ground potential, which is LOW or a logic 0, MOSFET MN0 remains in the OFF state with power rails PWR1 and PWR2 isolated from each other.

During operation of the ESD clamp for two power supply rails in the presence of an ESD event where the first power rail PWR1 is stressed with respect to the second power rail PWR2, the voltage at the junction of R1A and C1A changes in accordance with the time constant established by resistor R1A and capacitor C1A and causes the state of the input to the first inverter in the series of inverters, and concomitantly the state of the output of the first inverter in the series of inverters, to change state.

In particular, the exemplary circuit shown in FIG. 1, solves problems associated with conventional devices.

As in otherwise conventional ESD implementations, an ESD diode 402a is implemented between a common ground GND and the first power rail PWR1, and another ESD diode 402b is implemented between the common ground GND and the second power rail PWR2. While shown as separate devices, the ESD diodes 402a, 402b are commonly inherent in a CMOS process, because n-wells are tied to power, while the substrate is grounded.

A large nMOSFET transistor MN0 is implemented with a channel connected between the first power rail PWR1 and the second power rail PWR2. The gate of the nMOSFET MN0 is labeled VG, and is importantly not connected to the output I3A0 or I3B0 of respective last inverter stages I3A or I3B. This is because the pFET transistor of each inverter stage I3A, I3B is realized by the present inventors to leak current.

Instead, the gate node VG to the large transistor MN0 is connected to a node between two nMOSFET transistors, MNA and MNB, connected with their current paths in series between the first power rail PWR1 and the second power rail PWR2.

The large nMOSFET is turned ON by either an ESD event detected by resistor R1A and capacitor C1A of a first ESD clamp 701a implemented for the first power rail PWR1, or by an ESD event detected by resistor R1B and capacitor C1B of a second ESD clamp 701b implemented for the second power rail PWR2.

ESD events on the first power rail PWR1 are further detected by a series connection of inverters. In the illustrated embodiment, three inverters were used, I1A, I2A and I3A. ESD events on the second power rail PWR2 are further detected by a series connection of inverters. In the illustrated embodiment, three inverters were used I1B, I2B and I3B. As is known in the art, fewer or more inverters may be implemented in a driver stage.

The change in state at the output of the first inverter ripples through the series of inverters as is known in the art. Also as is known in the art, the transistor sizes in the series of inverters IA1, IA2, and IA3, as well as the transistor sizes in the series of inverters IB1, IB2, and IB3, may be progressively larger for each inverter in the series of inverters.

During an ESD event RC circuit comprised of resistor R1A connected in series with capacitor C1A, generates a HIGH input to the first inverter I1A of the ESD clamp 701a implemented for the first power rail PWR1. Similarly, an RC circuit comprised of resistor R1B connected in series with capacitor C1B, generates a HIGH input to the first inverter I1B of the ESD clamp 701b implemented for the second power rail PWR2.

Both RC circuits define time constants that are preferably of the microsecond duration, which is long enough to detect an ESD event, but short enough to not turn ON during power up.

The large nMOSFET transistor MN0 is preferably sized for the particular application. In given embodiments, the gate width is preferably between 1000 microns and 10,000 microns. For example, the device width of the large nMOSFET transistor MN0 may be 5000 or 6000 microns.

Two control nMOSFET transistors F1, F2 control the gate node VG during normal (i.e., non ESD event) operation. The first nMOSFET transistor F1 has its channel connected between the common ground GND and the gate node VG, with its gate connected to the first power rail PWR1 through an appropriate resistance R10. The second nMOSFET transistor F2 has its channel connected between the common ground GND and the gate node VG, with its gate connected to the second power rail PWR2 through an appropriate resistance R11. One skilled in the art would know how to size resistors R10 and R11 to maintain the respective gates of nMOSFET transistors F1 and F2 pulled to ground, GND.

During normal operation of the circuit shown in FIG. 1, the circuit logic is such that the large nMOSFET (MN0) gate (node VG) is pulled by two nMOSFETs F1 and F2 to ground.

However, during an ESD event, if the first power rail PWR1 is stressed with respect to the second power rail PWR2, the circuit between the first power rail PWR1 and ground GND will provide the trigger for the gate of the large ESD clamping transistor MN0, which is pulled HIGH by the previous stage nFET.

Importantly, there is an nFET in the last stage of the circuit shown in FIG. 1, and not a full CMOS logic inverter.

Introduction of a pFET transistor into the last stage where the power rails PWR1 and PWR2 are driving a common node VG will cause a parasitic diode in the pMOSFET to turn on and conduct during an ESD event, instead of charging up the VG node. Thus, a PFET in the last stage including the common node VG is preferably avoided.

It is important to size nMOSFET transistors F1, F2 such that they will not have a significant adverse effect on the charging of the gate node VG of the ESD clamping transistor MN0 during an ESD event.

Figure 2:
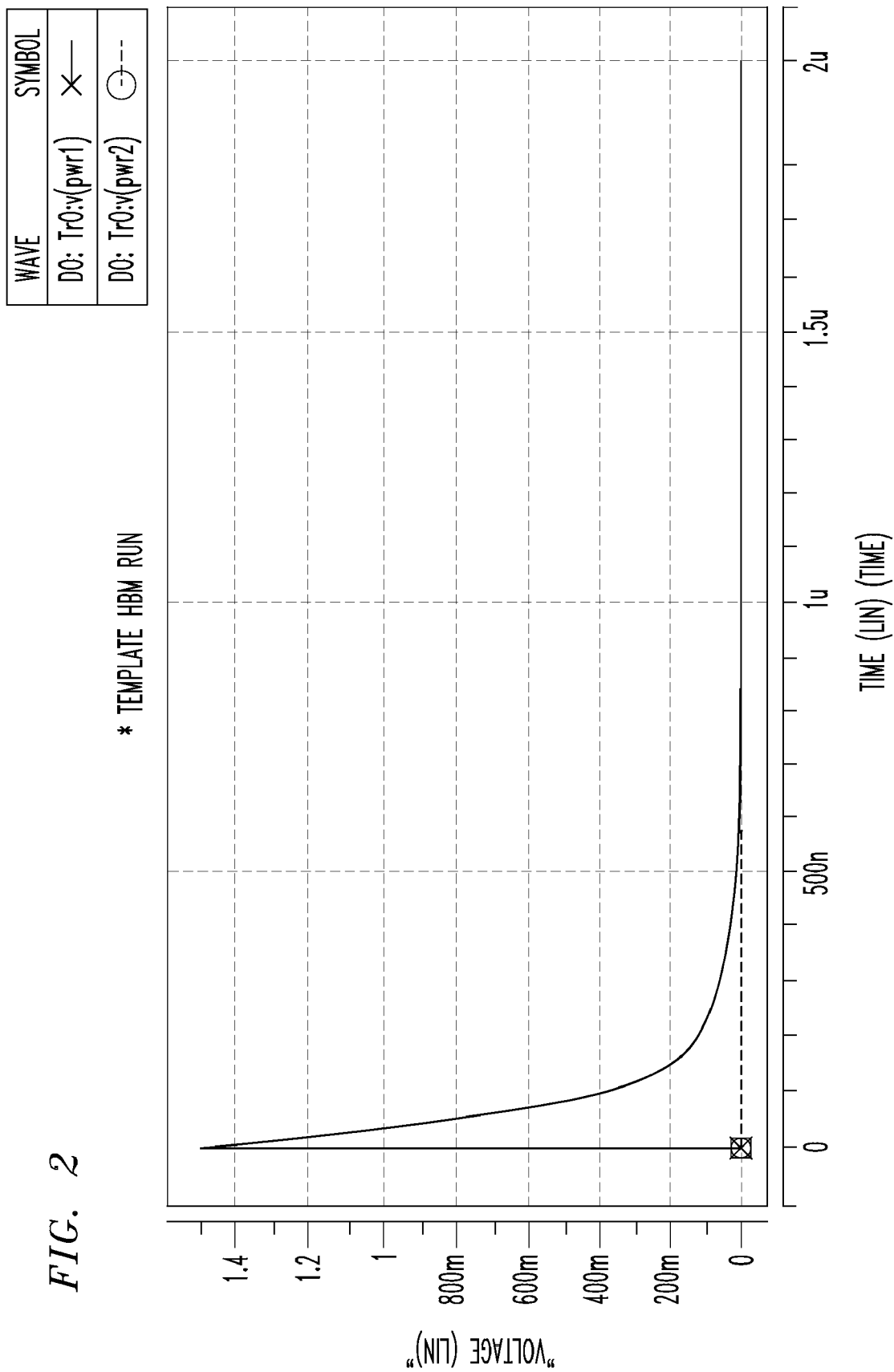
FIG. 2 demonstrates voltage damping for the exemplary ESD clamp shown in FIG. 2, in response to a model ESD surge.
Figure 3:
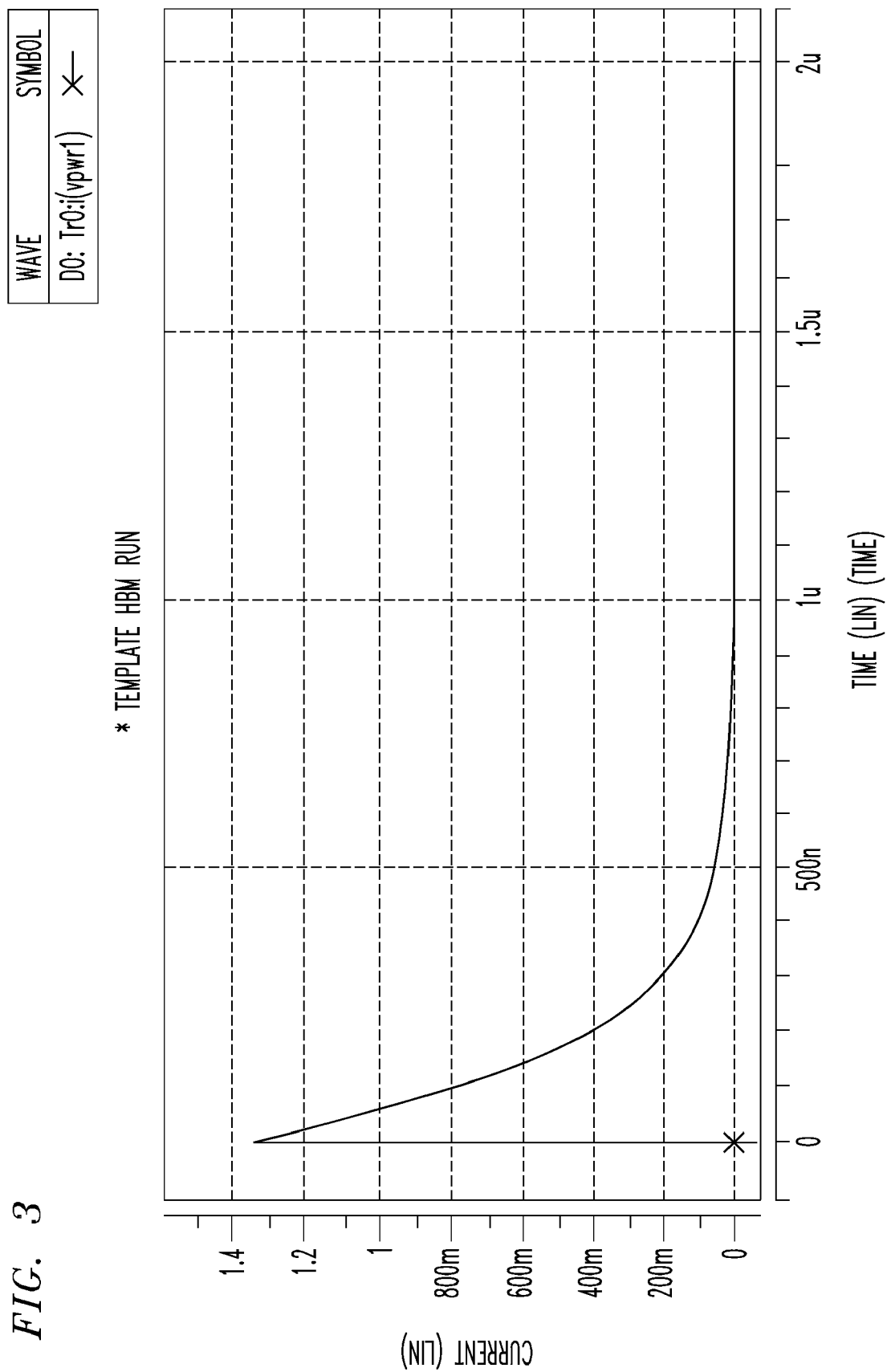
FIG. 3 demonstrates current damping for the exemplary ESD clamp shown in FIG. 2, in response to a model ESD surge.
Figure 4:
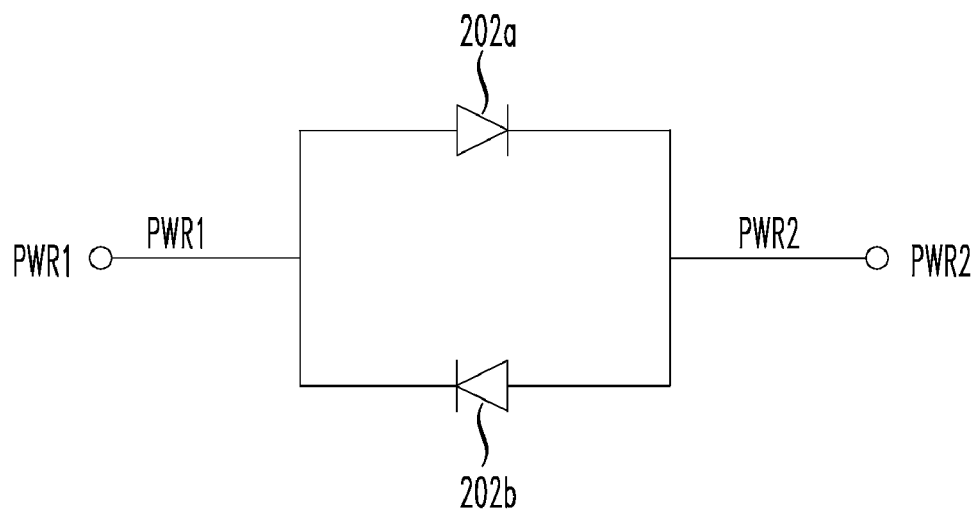
FIG. 4 shows a conventional technique for providing an electrostatic discharge (ESD) path between two power pins.
Figure 5:
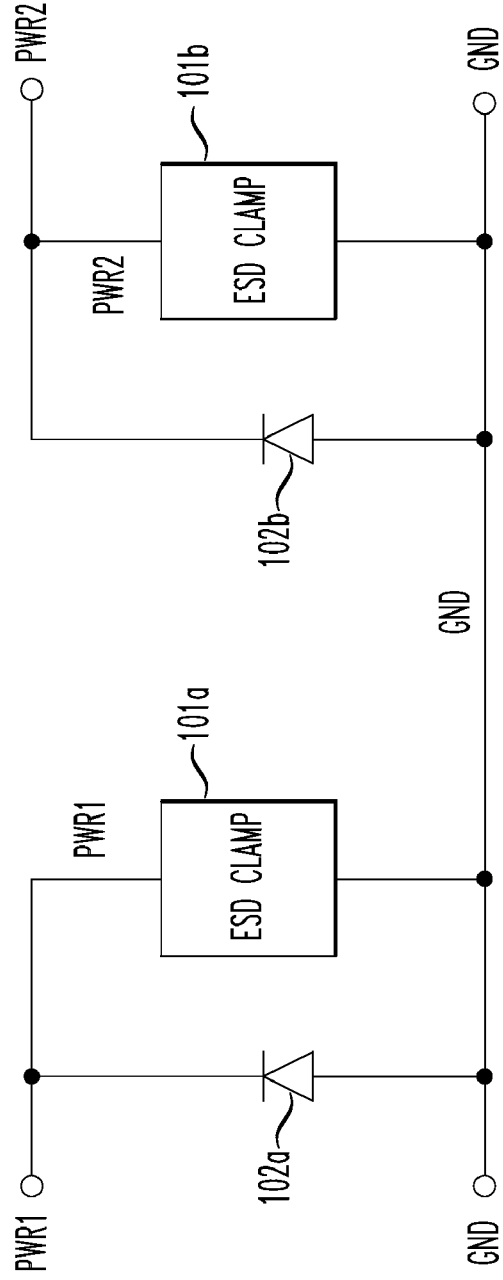
FIG. 5 shows another conventional technique for providing an electrostatic discharge (ESD) path between two isolated power pins.
Figure 6:
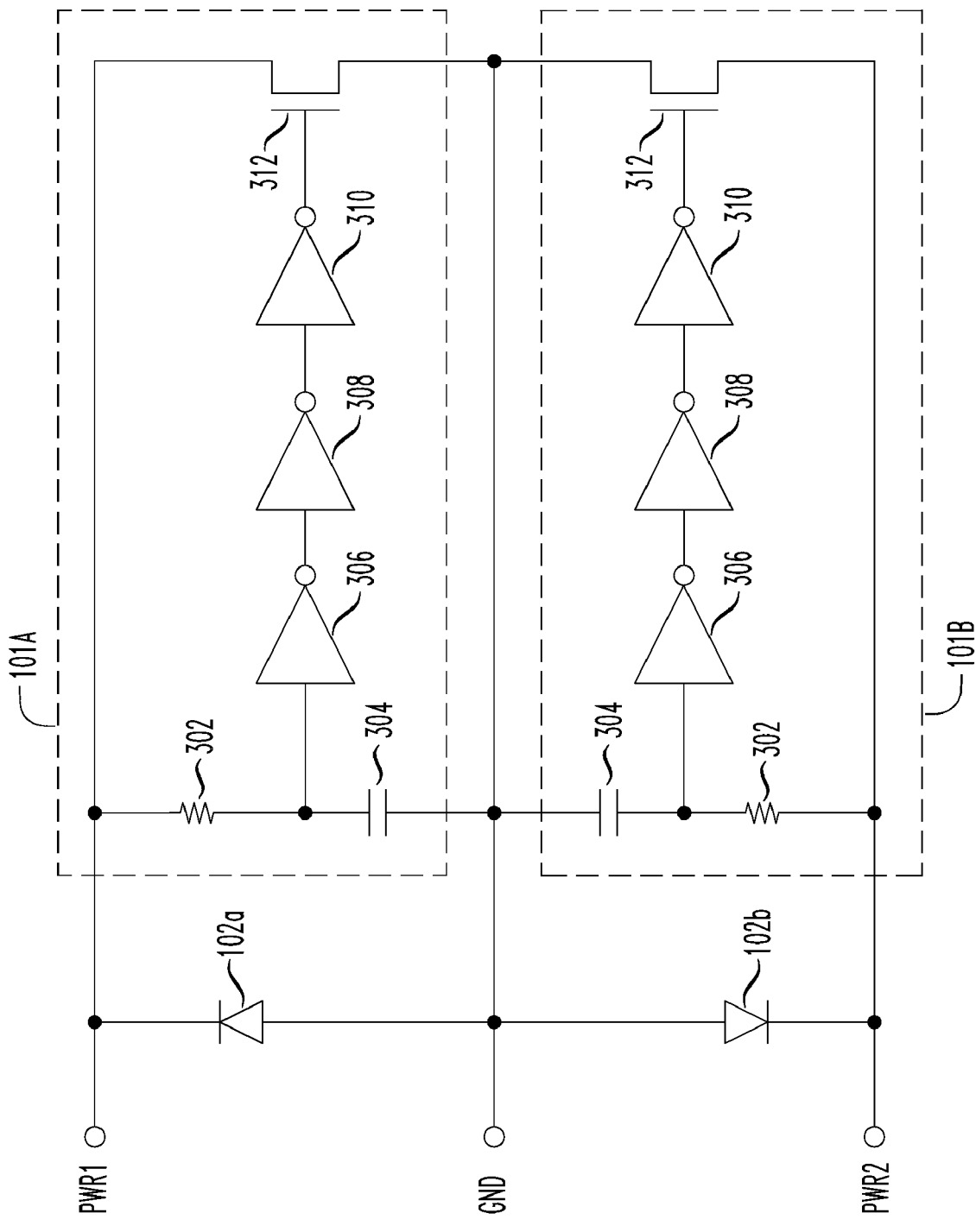
FIG. 6 shows in more detail the conventional technique for providing an electrostatic discharge (ESD) path between two isolated power pins shown in FIG. 5.

FIGS. 2 and 3 show simulation results with a 2k volt human body model (HBM) 2000 volt ESD simulated surge.

The HBM simulated ESD pulse is a simulation of a body charged and discharged through a model 100 pF capacitor with a resistance of contact of 1500 ohms. According to the simulation, the 100 pF capacitor is charged to 2000 volts, with the other side of the capacitor connected to ground, and then discharged through 1500 ohms into an IC pin.

The FIG. 2 simulation shows that the voltage of an ESD pulse is clamped at about 1.5 volts during the simulated ESD event.

FIG. 3, a result of the same simulation, shows that the current during the same ESD event is clamped at about 1.33 amps. This is very close to the ideal, which is 2000 volts/1500 ohms, or 1.3 amps, with a 100 pF/1500 ohms, or 150 nanosecond decay.

is clamped at approximately 1.33 amps.

Because the circuit of FIG. 1 is entirely symmetrical in design, the same operation applies for swapping the one power rail, e.g., PWR2, with respect to the operation as described above for the other power rail, e.g., PWR1.

The present invention is applicable in applications having two or more power supply rails in an integrated circuit. The inventive technique can be employed between any two power rails regardless of the respective voltage levels, and whether or not one power supply is OFF while other power supplies are ON.

Moreover, the circuit architecture of the present invention does not consume a DC current, so it is applicable for use in power sensitive integrated circuit designs (e.g., small consumer devices, laptop computers, etc.)

While the invention has been described with reference to the exemplary embodiments thereof, those skilled in the art will be able to make various modifications to the described embodiments of the invention without departing from the true spirit and scope of the invention.

What is claimed is:

1. An integrated circuit including an electrostatic discharge circuit, the integrated circuit having at least two power supply rails, comprising:
    a first electrostatic discharge event detection circuit connected to a first power supply rail;
    a second electrostatic discharge event detection circuit connected to a second power supply rail;
    a first field effect transistor having a channel, said channel connected between said first power supply rail and said second power supply rail;
    a second field effect transistor having a channel, said channel connected between a gate of said first field effect transistor and one of said first power supply rail and said second power supply rail;
    at least one inverter stage having an output, said output connected to a gate of said second field effect transistor; and
    a gate control circuit operative to selectively connect the gate of said first field effect transistor to a common ground of said first power supply rail in response to the first power supply rail being at least equal to a transistor threshold voltage level and to selectively connect the gate of said first field effect transistor to a common ground of said second power supply rail in response to the second power supply rail being at least equal to the transistor threshold voltage level.

2. The integrated circuit according to claim 1, wherein:
said first power supply rail is connected directly to a first pin external to said integrated circuit; and
said second power supply rail is connected directly to a second pin external to said integrated circuit.

3. The integrated circuit according to claim 1, wherein the gate control circuit comprises:
    at least third and fourth field effect transistors, the third field effect transistor having a channel connected between the gate of said first field effect transistor and the common ground of said first power supply rail and having a gate coupled to the first power supply rail through a first resistance, the fourth field effect transistor having a channel connected between the gate of said first field effect transistor and the common ground of said second power supply rail and having a gate coupled to the second power supply rail through a second resistance.

4. The integrated circuit according to claim 1, wherein said at least one inverter stage comprises:
    a series connection of a plurality of inverters;
    wherein said second field effect transistor is switched to a conductive state during an electrostatic discharge event by a last stage inverter of said plurality of inverters.

5. The integrated circuit according to claim 4, further comprising:
    an RC circuit connected to an input of a first stage of said plurality of inverters, to maintain a logic HIGH level on said input during normal operation of said integrated circuit.

6. The integrated circuit according to claim 4, wherein:
said plurality of inverters comprises at least three inverters.

7. The integrated circuit according to claim 1, further comprising:
    an electrostatic discharge diode function connected between said first power supply rail and a ground.

8. The integrated circuit according to claim 1, further comprising:
    an electrostatic discharge diode function connected between said second power supply rail and a ground.

9. The integrated circuit according to claim 1, wherein:
said first power supply rail and said second power supply rail have a common ground.

10. The integrated circuit according to claim 1, wherein:
said first field effect transistor is a metal oxide semiconductor field effect transistor (MOSFET).

11. The integrated circuit according to claim 10, wherein:
said MOSFET is an n-type MOSFET.

12. The integrated circuit according to claim 11, wherein:
said n-type MOSFET has a device width of between 1000 microns and 10,000 microns.

13. The integrated circuit according to claim 11, wherein:
said n-type MOSFET has a device width of between about 5000 microns and about 6000 microns.

14. The integrated circuit according to claim 1, wherein:
voltage levels of the first and second power supply rails are not the same at the same time.

15. A method of clamping an electrostatic discharge pulse in an integrated circuit having at least first and second power supply rails, said method comprising:
    sensing an electrostatic discharge event on at least one of said at least first and second power supply rails;
    in response to said sensing said electrostatic discharge event, biasing a gate of a first field effect transistor having a channel connected between said at least first and second power supply rails;
    switching the channel of said first field effect transistor to a conductive state with biasing from a channel of a second field effect transistor connected between said gate of said first field effect transistor and one of said at least first and second power supply rails;
    biasing a gate of said second field effect transistor with an output of at least one inverter stage; and
    switching the gate of said first field effect transistor to a common ground of said first power supply rail in response to the first power supply rail being at least equal to a transistor threshold voltage level and switching the gate of said first field effect transistor to a common ground of said second power supply rail in response to the second power supply rail being at least equal to the transistor threshold voltage level.

16. The method of clamping an electrostatic discharge pulse in an integrated circuit according to claim 15, wherein:
switching the gate of said first field effect transistor to a common ground of said at least first and second power supply rails is performed during normal operation of said integrated circuit.

17. The method of clamping an electrostatic discharge pulse in an integrated circuit according to claim 15, wherein:
said first field effect transistor is a metal oxide semiconductor field effect transistor (MOSFET).

18. The method of clamping an electrostatic discharge pulse in an integrated circuit according to claim 17, wherein:
said MOSFET is an n-type MOSFET.

19. The method of clamping an electrostatic discharge pulse in an integrated circuit according to claim 18, wherein:
said n-type MOSFET has a device width of between 1000 microns and 10,000 microns.

20. The method of clamping an electrostatic discharge pulse in an integrated circuit according to claim 18, wherein:
said n-type MOSFET has a device width of between about 5000 microns and about 6,000 microns.

21. The method of clamping an electrostatic discharge pulse in an integrated circuit according to claim 15, wherein:
said channel of said first field effect transistor is connected directly across said at least first and second power supply rails.

22. Apparatus for clamping an electrostatic discharge pulse in an integrated circuit having at least first and second power supply rails, comprising:
means for sensing an electrostatic discharge event on at least one of said at least first and second power supply rails;
means for biasing, in response to said sensing an electrostatic discharge event, a gate of a first field effect transistor having a channel connected between said at least first and second power supply rails;
means for switching a channel of said first field effect transistor to a conductive state with biasing from a channel of a second field effect transistor connected between said gate of said first field effect transistor and one of said at least first and second power supply rails;
means for biasing a gate of said second field effect transistor with an output of at least one inverter stage; and
means for switching the gate of said first field effect transistor to a common ground of said first power supply rail in response to the first power supply rail being at least equal to a transistor threshold voltage level and for switching the gate of said first field effect transistor to a common ground of said second power supply rail in response to the second power supply rail being at least equal to the transistor threshold voltage level.

23. The apparatus for clamping an electrostatic discharge pulse in an integrated circuit according to claim 22, wherein:
said means for switching the gate of said first field effect transistor to a common ground of said first and second power supply rails is performed during normal operation of said integrated circuit.

24. The apparatus for clamping an electrostatic discharge pulse in an integrated circuit according to claim 22, wherein:
voltage levels of two of the at least first and second power supply rails are not the same at the same time.

25. The apparatus for clamping an electrostatic discharge pulse in an integrated circuit according to claim 22, further comprising:
said channel of said first field effect transistor being connected directly across said at least first and second power supply rails.

* * * * *